United States Patent [19]

Carl et al.

[11] Patent Number: 4,842,147

[45] **Date of Patent: * Jun. 27, 1989**

[54] METHOD AND APPARATUS FOR CONDUCTIVE FILM DETECTION

[75] Inventors: William E. Carl; Ronald W. McGohon, both of Versailles, Ky.

[73] Assignee: GTE Products Corporation, Danvers, Mass.

[ * ] Notice: The portion of the term of this patent subsequent to Oct. 25, 2005 has been disclaimed.

[21] Appl. No.: 161,519

[22] Filed: Feb. 29, 1988

Related U.S. Application Data

[63] Continuation of Ser. No. 327,340, Dec. 4, 1981, Pat. No. 4,779,739.

[51] Int. Cl.[4] ........................ B07C 5/344; G01R 31/24

[52] U.S. Cl. ...................................... 209/575; 324/414

[58] Field of Search .................. 209/571, 575; 324/62, 324/414

[56] References Cited

U.S. PATENT DOCUMENTS

| | | | |
|---|---|---|---|
| 3,067,873 | 12/1962 | Petts et al. | 209/575 X |
| 3,586,168 | 6/1971 | Osheff et al. | 209/551 X |
| 3,750,016 | 7/1973 | Low et al. | 324/62 X |
| 3,967,191 | 6/1976 | Roche | 324/414 |
| 4,000,458 | 12/1976 | Miller et al. | 324/62 X |
| 4,021,727 | 5/1977 | Fellows | 324/414 |
| 4,075,557 | 2/1978 | Jurca | 324/62 |

*Primary Examiner*—Robert B. Reeves
*Assistant Examiner*—Edward M. Wacyra
*Attorney, Agent, or Firm*—Carlo S. Bessone

[57] ABSTRACT

The apparatus is used for detecting the proper conductivity of a conductive film enclosed within a nonconductive substrate or envelope such as a fluorescent lamp without requiring physical contact with the fluorescent lamp. The conductive film detector comprises a capacitive proximity switch mounted close to but spaced from the lamp as the lamp passes the inspection station. At the inspection station there is also provided a feeler switch for sensing lamp presence and a cam switch for inspection initiation when the lamp is instantaneously properly positioned. A control unit powers the capacitive proximity switch and receives the proximity switch output to control a lamp rejection mechanism for rejecting lamps having resistance that is too high. The set up procedure involved adjustment of the capacitive proximity switch sensitivity by using test lamps of alternately acceptable resistance and unacceptable resistance, along with adjustment of lamp-to-proximity switch spacing.

13 Claims, 2 Drawing Sheets

METHOD AND APPARATUS FOR CONDUCTIVE FILM DETECTION

This is a continuation of co-pending application Ser. No. 327,340 filed on Dec. 4, 1981, now U.S. Pat. No. 4,779,739.

BACKGROUND OF THE INVENTION

The present invention relates to a conductive film detector and associated method for detecting the proper conductivity of a conductive film enclosed within a nonconductive substrate or envelope such as the typical conductive film disposed within a fluorescent lamp.

The present method of detecting the presence and level of conductivity of a conductive film enclosed within a nonconductive substrate requires physical contact with the nonconductive substrate. In the case of detecting the conductive film typically found within the envelope of a fluorescent lamp, the requirement for physical contact makes it difficult to detect the conductive film particularly when detection is to occur under dynamic movement of the lamps in sequence past an inspection station. In a lamp processing apparatus the lamp ager provides for a continuous uninterrupted motion of the lamps in sequence and thus the requirement for physical contact to measure conductivity is quite apt to interfere or impede the lamp processing apparatus.

SUMMARY OF THE INVENTION

Accordingly, it is an object of the present invention to provide an apparatus for detecting the proper conductivity of a conductive film enclosed within a nonconductive substrate or an envelope such as a fluorescent lamp, without requiring physical contact with the fluorescent lamp envelope.

Another object of the present invention is to provide a method for detecting the presence and level of a conductive film in a fluorescent lamp without requiring physical contact with the lamp envelope.

A further object of the present invention is to provide a method and apparatus for conductive film detection employing a proximity switch means forming a conductivity sensor spaced from the fluorescent lamp and operating in a system in combination with, inter alia, a rejection mechanism for rejecting lamps having a resistance that is too high thus indicating a poor conductivity film within the fluorescent lamp.

Still another object of the present invention is to provide a method and associated apparatus for conductive film detection that can be used in the manufacture of a variety of conductive glass products and other types of nonconductive substrates with a conductive film applied thereto or associated therewith.

To accomplish the foregoing and other objects of this invention there is provided an apparatus or system for detecting a conductivity of a conductive film or the like enclosed within a conductive member. The apparatus as described in detail hereinafter, is adapted for use in detecting the conductive film disposed within a fluorescent lamp which is usually a metal oxide film such as tin oxide. The apparatus of this invention comprises means for supporting the nonconductive member at an inspection station, proximity switch means and means for supporting the proximity switch means at the inspection station in a position spaced from the nonconductive member. With regard to the application for fluorescent lamps, the means for supporting may comprise a conveying means adapted to hold a plurality of such lamps which pass at a continuous uninterrupted rate through the inspection station. The proximity switch means comprises a capacitive proximity sensor having a conductive element spaced from the conductive film and including means responsive to measured capacitance therebetween for generating a sensor signal representative of measured capacitance and in turn corresponding to the conductivity or resistance of the conductive film. The sufficiency of the applied conductive film particularly as to its thickness effects the capacitance between the film being measured and the conductive element associated with the capacitive proximity sensor. The apparatus also comprises control means including means for reading the sensor signal. Reject means is responsive to said means for reading for rejecting nonconductive members having a conductivity less than a predetermined conductivity level. The apparatus of this invention may also comprise position switch means disposed at the inspection station and activated when the fluorescent lamp is properly positioned relative to the proximity sensor. In this regard the control means includes means responsive to position switch means activation for initiating lamp inspection by permitting operation of the reject means. In a particular system described herein there is provided both an inspect time cam switch for sensing proper lamp presence and a feeler switch for also sensing lamp presence to prevent rejection operation when the lamp supporting means is empty. Both of these switches are preferably coupled in series from the capacitive proximity sensor to the control means whereby the control means receives the sensor signal but only when both of the switches are in their closed, activated position indicating that inspection is now to take place. The proximity switch means preferably comprises both a sensing head section and a detection section. The control means has means for coupling operating power to the detection section. The sensing head may comprise a capacitance bridge circuit.

In accordance with the present invention there is also provided a method of detecting the conductivity of a conductive film or the like enclosed within a nonconductive member without requiring physical contact of the member, associated with a member processing system in which successive ones thereof are adapted to pass under continuous motion through an inspection station. The method of this invention as described hereinafter, is adapted for use in the production of fluorescent lamps. The method of this invention comprises the steps of providing a capacitive proximity sensor adapted to provide a sensor signal, positioning the sensor at the inspection station so that the sensor is uniformly spaced from the member, detecting arrival of the member at the inspection station in proper adjacent uniform position relative to the sensor, and reading the sensor signal upon detection of member arrival to provide a rejection signal for members having a conductivity less than a predetermined conductivity, or alternatively having a resistance greater than a predetermined resistance. In practicing this method the lamps are adapted for passing through the inspection station so that the spacing between the sensor and lamp is maintained relatively uniform from lamp to lamp.

BRIEF DESCRIPTION OF THE DRAWINGS

Numerous other objects, features and advantages of the invention should now become apparent upon a reading of the following detailed description taken in conjunction with the accompanying drawings in which.

DETAILED DESCRIPTION

Figure 1:
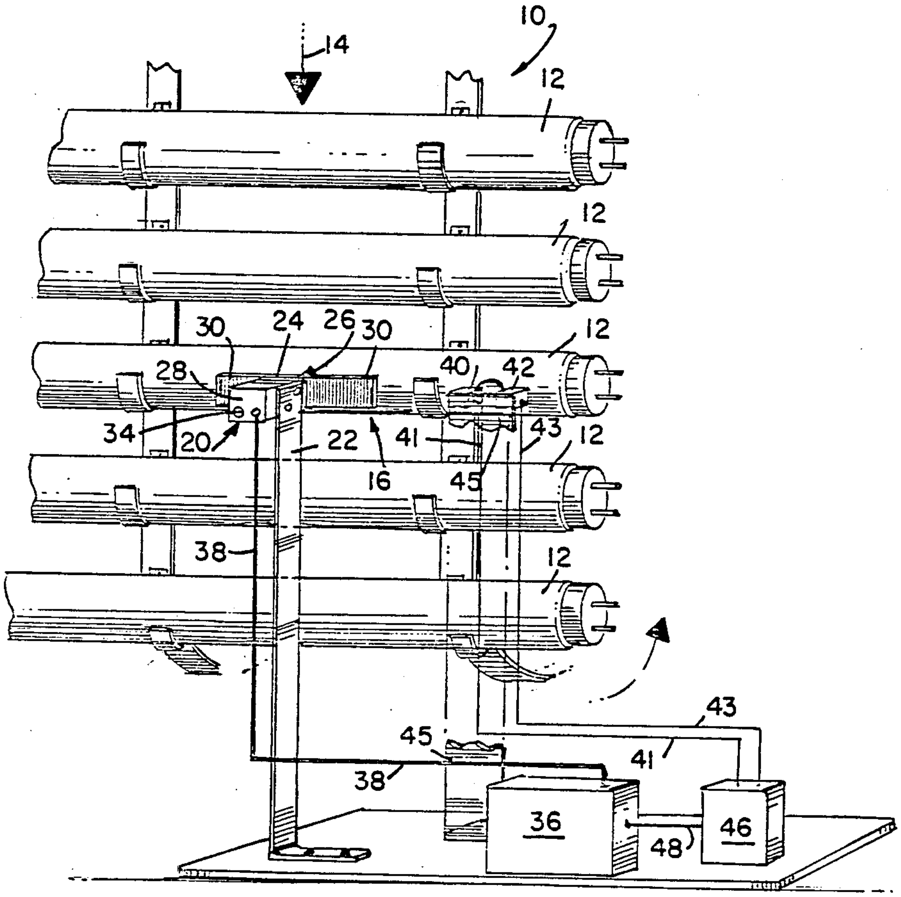
FIG. 1 is a perspective view, partly schematic, showing a conductive film detection system employing a capacitive proximity sensor shown in association with a fluorescent lamp processing system for measuring the internal conductive coating of a fluorescent lamp.

Referring to the drawing, there is shown a system and associated method for detecting the proper conductivity of a conductive film as applied to a system for processing fluorescent lamps. The detector of this invention is for detecting the conductivity of the internal conductive coating found in a fluorescent lamp. A capacitive proximity sensor is used to detect the conductive film by establishing a uniform spacing between the sensor and conductive film being measured so that teh capacitance preferably only varies with the thickness of the applied conductive film. Thus, by controlling the inspection so that the same proper spacing occurs between sensor and film each time a reading is taken the capacitance reading can then be used and interpreted as an indication of conductivity of the conductive film. The thicker the film, the greater the capacitance and in turn the lower the resistance (increased conductivity). Although described in connection with the processing of fluorescent lamps, it ` understood that the apparatus and method of this invention may also be used in the manufacturing of conductive glass products and other nonconductive substrates with a conductive film applied thereto.

Referring now to FIG. 1, there is shown a lamp processing apparatus which comprises a lamp holder mechanism (ager) 10 which is adapted to support a plurality of conventional fluorescent lamps 12 in a vertically disposed array with the lamps being spaced by a distance approximating the diameter of each lamp. In FIG. 1 the arrow 14 illustrates the direction of movement of the fluorescent lamps. Because the lamp holding mechanism 10 is of conventional design, it is not shown in detail herein but it is understood that it is adapted for operation so as to carry the lamps in the direction of arrow 14 at a constant speed and at a continuous, uninterrupted rate. The mechanism 10 carries the lamps individually by an inspection station 16 at which is disposed a capacitive sensing head 20. FIG. 1 illustrates a suitable support member 22 for fixedly supporting the sending head 20. The lamp holding mechanism 10 is adapted for operation at lamp speedfs from 0–5000 lamps per hour.

The capacitive sensing head 20 may be of conventional design. In one embodiment there has been employed a Robertshaw proximity switch, part No. 298-1002-00 made by the Acro Division of Robertshaw Control Company, Columbus, OH. FIG. 1 illustrates as part of the head 20, an insulator plate 24 disposed intermediate the head housing 28, and a conductive plate element 26. Also shown in FIG. 1 are extensions 30 which may be constructed of ⅛ inch thick aluminum. The total extension 30 from end to end is 9 inches and has a height of ¾ inch. The preferred spacing between the lamp 12 at the inspection station, and the conductive plate element and associated extensions in on the order of ¼–1 inch. However, this dimension may be varied depending upon the type of sensor employed and the nature of the fluorescent lamp. Associated with the sensing head 20 is also a sensitivity adjustment 34 to be discussed in detail hereinafter.

FIG. 1 also shows a power supply and detector unit 36 coupled by electrical line 38 from the capacitive sensing head 20. There are also provided at the inspection station two switches schematically illustrated in FIG. 1. One of these switches is a feeler switch 40. This switch is for detecting the presence of a lamp to prevent the reject gate from activating when the ager head is empty. The other switch is a cam switch 42 which is for initiating inspection of the detector output when the lamp is directly in front of the sensing head 20. The switches 40 and 42 are shown illustratively in FIG. 1 fixedly supported by a suitable support member 45 and coupled by respective lines 41 and 43 to the control unit 46. Electrical interconnection also occurs by way of line 48 between units 36 and 46.

Figure 2:
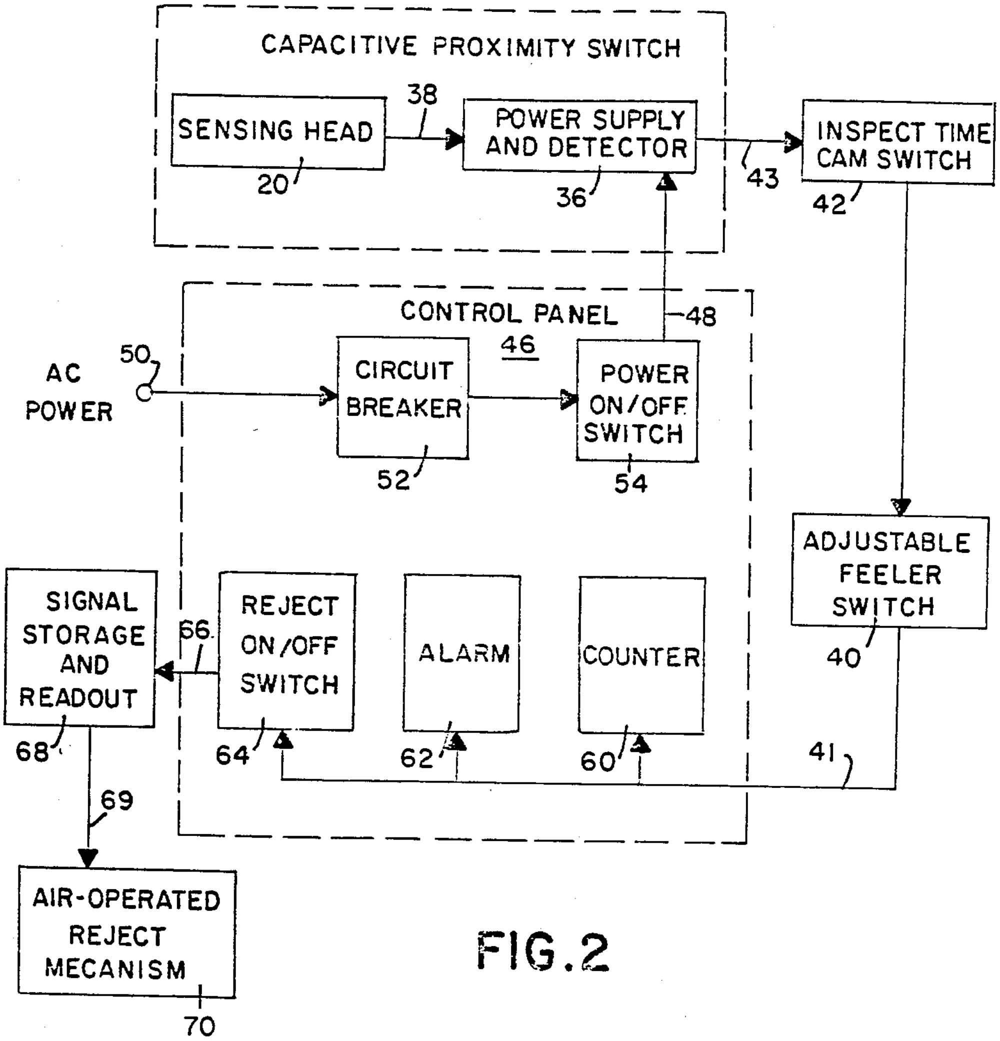
FIG. 2 is a block diagram of the conductive film detector of FIG. 1.

FIG. 2 is a block diagram showing many of the parts previously discussed with reference to FIG. 1. Thus, in FIG. 2 there is shown a capacitive proximity switch which comprises the sensing head 20 and the power supply and detector unit 36. Also shown in FIG. 2 are the switches 40 and 42. The control unit or control panel 46 is shown in more detail in FIG. 2 as comprising an input AC power terminal 50, circuit breaker 52 and power on/off switch 54. AC power is applied at the terminal 50 by way of the circuit breaker 52 and the switch 54, when in "on" position, by way of line 48 to the unit 36. The operation of the units 20 and 36 of the capacitive proximity switch are discussed in more detail hereinafter.

The control panel 46 also comprises a counter 60, alarm 62, an a reject on/off switch 64. The line 41 interconnects the adjustable feeler switch 40 with each of the counter 60, alarm 62, and switch 64. The counter 60 may be of conventional design and is simply adapted to receive the sensor signal on line 41 to increment the counter. The counter is for keeping track of the number of rejections in a batch of lamps. The alarm 62 may be a visual or audible alarm for providing an indication of lamp rejection. The switch 64 receives the sensor signal on line 41 and couples this by way of line 66 to the signal storage and readout device 68 and in turn by way of line 69 to the air operated reject mechanism 70. The device 68 and the mechanism 70 may be of conventional design. For example, the unit 68 may comprise relay means. The switch 64 may comprise transistor switching means.

As indicated previously, the sensing head 20 may be a Robertshaw device, part No. 298-1002-00. The sensing head may comprise a capacitance bridge circuit, one arm of which is the front plate 26 having an associated extension 30 connected thereto. A fluorescent lamp with an internal conductive coating in close proximity to the extension increases this capacitance in proportion to the amount and thickness of the conductive coating. The bridge circuit also has a second arm which is an adjustable capacitance tuneable to the desired operating unit. In this connection there is provided a sensitivity adjustment 34 shown in FIG. 1 which may be adjusted in a manner to be described hereinafter.

The counterpart to the sensing hed 20 is the power supply and detector unit 36 which is shown in FIG. 2 together with the sensing head as forming the capacitive proximity switch. The unit 36 may be a Robertshaw type part No. 298-2001-00. The entire Robertshaw proximity switch is identified by their part number 298-3100-00. The capacitive proximity switch illustrated in FIG. 2, in addition to comprising the capacitance bridge circuit also comprises an oscillator with the bridge circuit controlling the amplitude of the oscillator, a detector stage which inverts the oscillator output into a DC signal, a transistorized bistable switch which is controlled by the detector stage output, a plug-in double pole, double throw relay operated by the bistable switch, and a voltage regulated power supply. The oscillator, detector and bistable switch are contained within the sensing head 20 which is preferably embodied in a stainless steel housing. The aforementioned plug-in relay is mounted on a power supply circuit board contained within the unit 36. A ten foot cable 38 equipped with plug and connectors is furnished as a standard item to connect the sensing head 20 and the unit 36. As mentioned previously, the power for the unit 36 is coupled by way of line 48 from the control panel 46.

Another capacitive proximity switch that can be used may be Model PC 127 available from Gordon Engineering Corporation of 67 Del Mar Drive, Brookfield, Conn. Also, refer to an article in "Machine Design" of Dec. 6, 1978, entitled "Greater Precision for Non-Contact Sensors" by L. Michelson.

The adjustable feeler switch 40 may be a capacitive type switch, metal switch or simply a feeler arm for detecting the presence of a lamp in position. This prevents operation of the reject mechanism when the ager head is empty. The inspect time cam switch 42 is used for initiating inspection of the detector output but only when the lamp is directly in front of the sensing head and in proper position for a reading to be taken. This switch essentially makes one revolution per lamp spacing between successive lamps. It is noted that the switches 40 and 42 are connected in series in FIG. 2 so that any signal generated from the unit 36 is only permitted to be coupled to line 41 when both switches are properly closed, thus indicating that the lamp is in the proper position for inspection.

The air operated reject mechanisms 70 may be of conventional type and may comprise a reject gate which is a mechanical apparatus for removing lamps that have been deemed to have an insufficient conductivity film.

The system described herein, has been used for the inspection of forty-eight inch long Sylvania SuperSaver 34 fluorescent lamps (manufactured by GTE Products Corporation, Versailles, KY) to detect the proper amount of conductive coating and rejecting those lamps with too high a coating resistance. The system of this invention is readily adapted for inspection of other length lamps and in this case would normally only require modification of the aluminum extension 30 on the sensing head to adapt to different length lamps.

The sensing head 20 is preferably disposed on the unload side of the lamp ager and inspects conductively coated lamps as they pass by in continuous motion. The sensing head is adapted to be positioned directly in front of the lamp such as in the position shown in FIG. 1, when the inspection cam switch and lamp feeler switch are closed. This position is essentially at the middle of the lamp horizontally and sufficiently close to the lamp to eliminate any effect from adjacent lamps. As indicated previously, the spacing between the sensor head and the lamp is preferably on the order of $\frac{1}{2}$–1 inch.

In order to operate the conductive film detector of this invention there is provided a set up procedure for adjusting the sensitivity of the proximity switch. This adjustment may be made by means of the adjusting screw 34 shown in FIG. 1. First, a coated lamp with a known, acceptable film resistance is disposed in front of the sensing head and the sensitivity is adjusted by means of the adjustment screw 34 so that a detection occurs. Thereafter, another lamp with a known, rejectable film resistance is placed in front of the sensing head and the sensitivity is again adjusted, if necessary, so that no detection occurs. This procedure may be alternated along with the moving of the sensing head closer to or further from the lamp until the detector is adjusted so as to accept those lamps with a film resistance less than a desired operating point, and reject those with a film resistance greater than such desired operating point. With regard to the block diagram of FIG. 2, the power supply and detector unit 36 may be set up so that a normal output therefrom coupled by way of the switches 40 and 42 corresponding to an acceptable lamp, maintains the reject switch 64 in its "off" state. Upon inspection of the poor conductivity lamp, the signal coupled to the switch 64 changes to a state which switches the switch 64 to its "on" state for operating the rejection mechanism 70.

Having described one embodiment of the present invention it should now be apparent to those skilled in the art that numerous other embodiments are contemplated as falling within the scope of this invention. For example, in the specific example described herein the lamps are advanced downward past the sensing head. However, the system of this invention may also be used with fluorescent lamps or other items that are adapted for advancement in different directions. However, it is preferred that the spacing between the lamps and the sensing head be maintained fairly constant particularly for applications requiring close discrimination of the resistance range.

What is claimed is:

1. Apparatus for detecting the conductivity of a conductive film enclosed within a nonconductive member comprising;

means for supporting the nonconductive member at an inspection station, proximity switch means, means for supporting the proximity switch means at the inspection station and spaced from the nonconductive member, said proximity switch means comprising a capacitive proximity sensor having a single conductive element spaced from the conductive film and including means responsive to measured capacitance therebetween for generating a sensor signal representative of measured capacitance, control means including means for reading said sensor signal, and reject means responsive to said means for reading for rejecting nonconductive members having a conductivity less than a predetermined conductivity.

2. Apparatus as set forth in claim 1 wherein said nonconductive member comprises a fluorescent lamp having a metal oxide as the conductive film.

3. Apparatus as set forth in claim 2 wherein the means for supporting comprises a conveying means adapted to hold a plurality of fluorescent lamps passing by continuous motion through said inspection station.

4. Apparatus as set forth in claim 3 including position switch means mounted at the inspection station and activated when the lamp is properly positioned relative to the proximity sensor, said control means including means responsive to position switch means activation for initiating lamp inspection by permitting operation of said reject means.

5. Apparatus as set forth in claim 3 including an inspect time cam switch for sensing proper lamp presence and a feeler switch for also sensing lamp presence to prevent lamp rejection means operation when the lamp supporting means is empty.

6. Apparatus as set forth in claim 5 including means coupling the cam switch and feeler switch in series from said capacitive proximity sensor to said control means whereby said control means receives said sensor signal but only when both said switches are closed.

7. Apparatus as set forth in claim 3 wherein said means for supporting maintains the lamps at a uniform distance from the sensor from lamp to lamp.

8. Apparatus as set forth in claim 1 wherein said proximity switch means comprises a sensing head secton and detection section, said control means having means for coupling operating power to said detection section.

9. Apparatus as set forth in claim 8 wherein said means for reading includes an on/off switch means.

10. Apparatus as set forth in claim 9 wherein said control means also includes counter means and alarm means.

11. A method of detecting the conductivity of a conductive film enclosed within a nonconductive member without requiring physical contact of the member, in a member processing system in which successive ones thereof are adapted to pass under continuous motion through an inspection station comprising the steps of;

providing a capacitive proximity sensor having a single conductive element and adapted to provide a sensor signal, positioning the sensor at the inspection station so that the sensor is uniformly spaced from the member, detecting arrival of the member at the inspection station in proper adjacent uniform position relative to the sensor, and reading the sensor signal upon detection of member arrival to provide a rejection signal for members having a conductivity less than a predetermined conductivity.

12. A method as set forth in claim 11 including the step of selectively providing operating power to the sensor.

13. A method as set forth in claim 11 including generating an alarm signal in response to said sensor signal.

* * * * *